US011854958B2

(12) United States Patent
Aimi et al.

(10) Patent No.: US 11,854,958 B2
(45) Date of Patent: Dec. 26, 2023

(54) WAFER LEVEL STACKED STRUCTURES HAVING INTEGRATED PASSIVE FEATURES

(71) Applicant: General Electric Company, Schenectady, NY (US)

(72) Inventors: Marco Francesco Aimi, Niskayuna, NY (US); Joseph Alfred Iannotti, Glenville, NY (US); Joleyn Eileen Brewer, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/875,205

(22) Filed: Jul. 27, 2022

(65) Prior Publication Data

US 2022/0367339 A1 Nov. 17, 2022

Related U.S. Application Data

(62) Division of application No. 16/666,016, filed on Oct. 28, 2019, now Pat. No. 11,430,728.

(51) Int. Cl.
*H01L 21/48* (2006.01)
*B81C 1/00* (2006.01)
(Continued)

(52) U.S. Cl.
CPC ........ *H01L 23/5222* (2013.01); *B81B 7/0074* (2013.01); *B81B 7/02* (2013.01); *B81C 1/0015* (2013.01); *B81C 1/00269* (2013.01); *B81C 3/001* (2013.01); *B81C 3/008* (2013.01); *H01L 21/486* (2013.01); *H01L 21/4807* (2013.01);
(Continued)

(58) Field of Classification Search
None
See application file for complete search history.

(56) References Cited

U.S. PATENT DOCUMENTS 5,602,052 A  2/1997 Beasom
5,841,182 A  11/1998 Linn et al.
(Continued)

FOREIGN PATENT DOCUMENTS

WO  2016133457 A1  8/2016

OTHER PUBLICATIONS

Tseng et al., "A Monolithic Three-Axis Accelerometer with Wafer-Level Package by CMOS MEMS Process†", Proceedings of Eurosensors 2017, vol. 1, Issue: 4, pp. 1-6, Aug. 11, 2017.

*Primary Examiner* — Erik Kielin
(74) *Attorney, Agent, or Firm* — Armstrong Teasdale LLP

(57) ABSTRACT

A method includes obtaining an active feature layer having a first surface bearing one or more active feature areas. A first capacitor plate of a first capacitor is formed on an interior surface of a cap. A second capacitor plate of the first capacitor is formed on an exterior surface of the cap. The first capacitor plate of the first capacitor overlays and is spaced apart from the second capacitor plate of the first capacitor along a direction that is orthogonal to the exterior surface of the cap to form the first capacitor. The cap is coupled with the first surface of the active feature layer such that the second capacitor plate of the first capacitor is in electrical communication with at least a first active feature of the active feature layer. The cap is bonded with the passive layer substrate.

20 Claims, 11 Drawing Sheets

(51) Int. Cl.
  *B81C 3/00* (2006.01)
  *H01L 21/60* (2006.01)
  *H01L 23/522* (2006.01)
  *B81B 7/02* (2006.01)
  *B81B 7/00* (2006.01)
  *H01L 49/02* (2006.01)
  *H01L 23/64* (2006.01)

(52) U.S. Cl.
  CPC .......... *H01L 28/40* (2013.01); *B81B 2201/01* (2013.01); *H01L 23/642* (2013.01); *H01L 2021/60015* (2013.01)

(56) References Cited

U.S. PATENT DOCUMENTS

| | | |
|---|---|---|
| 7,247,246 B2 | 7/2007 | Nasiri et al. |
| 7,297,613 B1 | 11/2007 | Mountain |
| 9,741,787 B2 | 8/2017 | West et al. |
| 2006/0258048 A1 | 11/2006 | Vrtis |
| 2007/0238262 A1 | 10/2007 | Summers |
| 2011/0018119 A1* | 1/2011 | Kim .................. H01L 24/73 257/690 |
| 2016/0320426 A1 | 11/2016 | Boysel et al. |
| 2018/0074090 A1 | 3/2018 | Boysel |
| 2020/0194542 A1* | 6/2020 | Alapati .................. H01L 24/17 |

\* cited by examiner

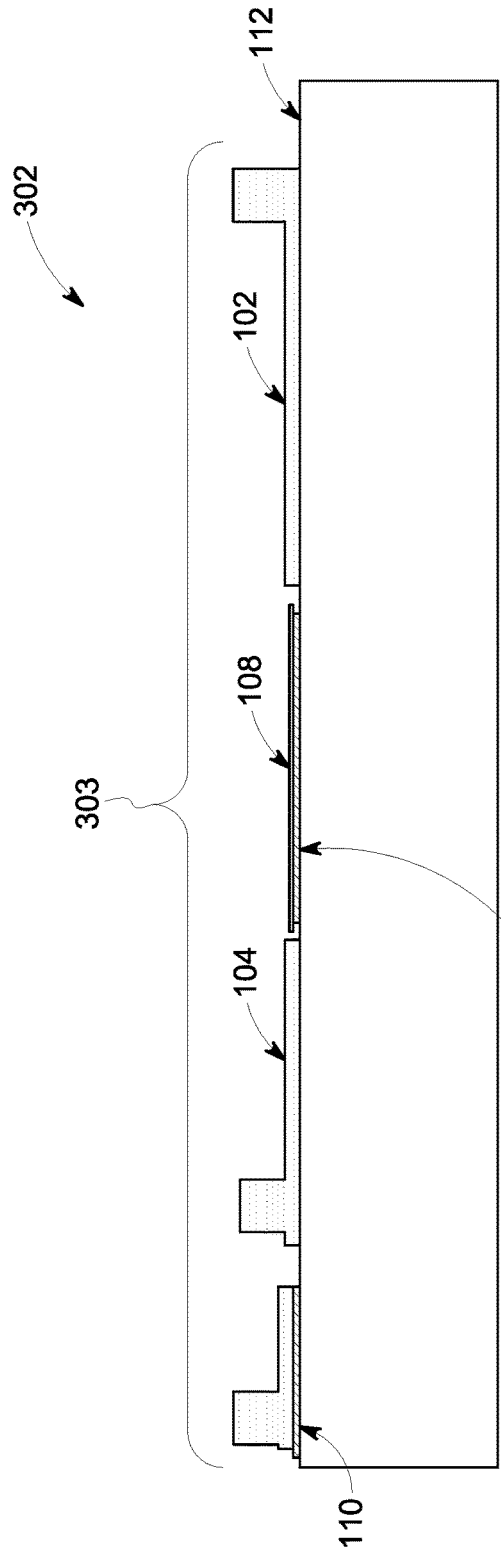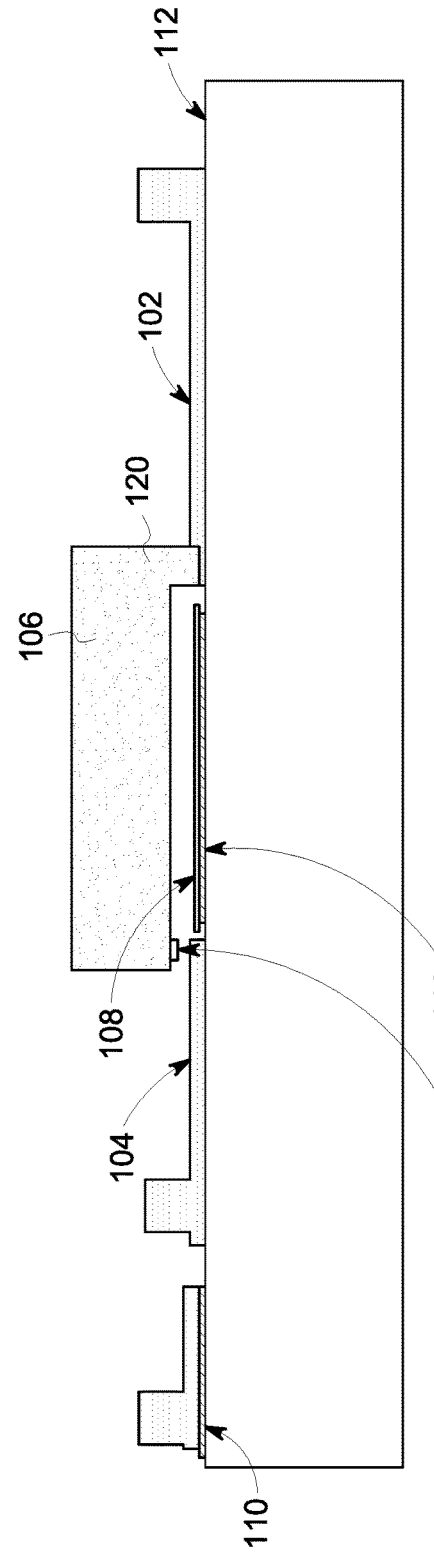
FIG. 3A
FIG. 3B

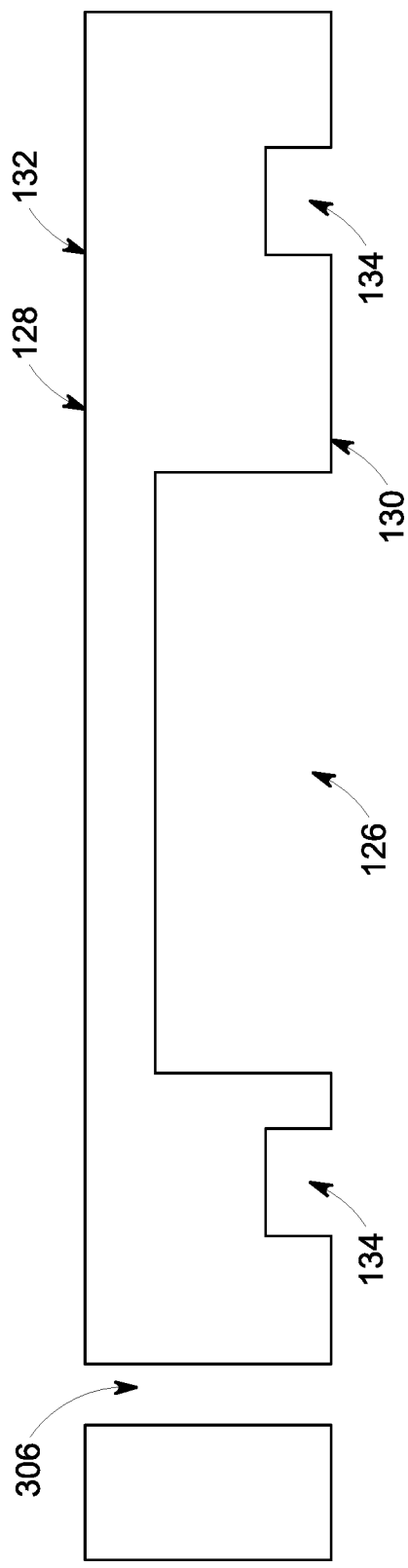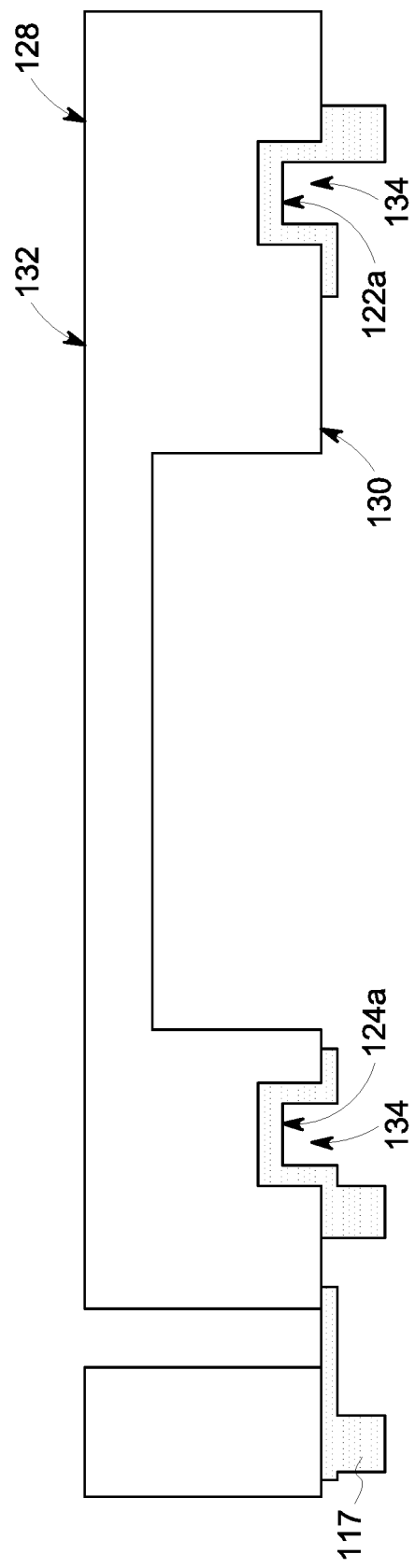

WAFER LEVEL STACKED STRUCTURES HAVING INTEGRATED PASSIVE FEATURES

CROSS REFERENCE TO RELATED APPLICATIONS

This application is a divisional of U.S. application Ser. No. 16/666,016, filed Oct. 28, 2019, and entitled "WAFER LEVEL STACKED STRUCTURES HAVING INTEGRATED PASSIVE FEATURES," the contents and disclosures of which are hereby incorporated by reference in their entirety.

BACKGROUND

MEMS features may include electromechanical MEMS features (e.g., switches, piezoelectric devices, and the like) and/or passive MEMS features (e.g., capacitors, resistors, inductors, and the like). For example, an RF module for a wireless device may employ tens of MEMS switches to facilitate receiving, processing, and transmitting signals and tens of MEMS capacitors to provide, e.g., direct current (DC) isolation on transmission lines and the like, to the resultant devices. Conventionally, device layers bearing passive MEMS features are formed separately from active feature layers bearing active features (e.g., sources, gates, drains, capacitors, resistors, and the like) and electromechanical MEMS feature layers bearing electromechanical MEMS features. The passive MEMS features are subsequently placed in conductive communication with at least the active features and coupled to the active feature layer and/or an intermediate layer such as an electromechanical MEMS feature layer.

Passive MEMS features may be formed directly on the cap layer of the radio frequency (RF) MEMS device or an intermediate layer (e.g., an electromechanical MEMS feature layer, and the like). There are numerous limitations and challenges associated with forming passive MEMS features directly on cap layers and/or on intermediate layers. Passive MEMS features are conventionally formed in fabrication processes that are adjunct to the processes used to form active feature layers and intermediate layers of RF MEMS devices (e.g., an RF MEMS switch). For example, passive MEMS features may be formed on portions of the active feature layer or an intermediate layer. In a further example, passive MEMS features may be formed directly on portions of the cap layer or intermediate layer using a metal/metal oxide/insulator-based process to form, e.g., a free-standing capacitor. Such a fabrication process may add significant time (e.g., days or weeks) and cost to the final RF MEMS device. Furthermore, passive MEMS features (e.g., capacitors) formed by such processes may suffer from edge effects impacting the maximum allowable voltage, inherent leakage, and asymmetric leakage with the polarity of voltage applied to the capacitor. Accordingly, RF MEMS devices and systems would benefit from a lower-cost and higher-performance approaches to packaging and integration.

BREIF DESCRIPTION

In one embodiment, a method includes obtaining an active feature layer. The active feature layer has a first surface bearing one or more active feature areas and a cap disposed on the active feature layer over the one or more active feature areas. A first electrical connection is formed in electrical communication with a first active feature through a first contact pad disposed on an interior surface of the cap. A first capacitor plate of a first capacitor is formed on an exterior surface of the cap in electrical communication with the electrical connection. A first bonding pad is formed at a different, spaced-apart location from the first capacitor plate on the exterior surface of the cap. A second capacitor plate of the first capacitor is formed on an interior surface of a passive layer substrate. The passive layer substrate includes at least one of a silicon-based ceramic, an aluminum-based ceramic, or a tantalum-based ceramic. The cap is coupled with the passive layer substrate so that a first area of the first bonding pad on the cap contacts the second capacitor plate of the first capacitor on the passive layer substrate and a different, second area of the second capacitor plate of the first capacitor overlays and is spaced apart from the first capacitor plate of the first capacitor along a direction that is orthogonal to the exterior surface of the cap to form the first capacitor. The cap is bonded with the passive layer substrate.

In one embodiment, a method includes obtaining an active feature layer having a first surface bearing one or more active feature areas. A first capacitor plate of a first capacitor is formed on an interior surface of a cap. A second capacitor plate of the first capacitor is formed on an exterior surface of the cap. The first capacitor plate of the first capacitor overlays and is spaced apart from the second capacitor plate of the first capacitor along a direction that is orthogonal to the exterior surface of the cap to form the first capacitor. The cap is coupled with the first surface of the active feature layer such that the second capacitor plate of the first capacitor is in electrical communication with at least a first active feature of the active feature layer. The cap is bonded with the passive layer substrate.

BRIEF DESCRIPTION OF THE DRAWINGS

The present inventive subject matter will be better understood from reading the following description of non-limiting embodiments, with reference to the attached drawings.

FIG. 3A-3E are schematic, partial cross-sectional views illustrating the fabrication steps of the process of FIG. 2 in accordance with embodiments herein.

DETAILED DESCRIPTION

Figure 1:
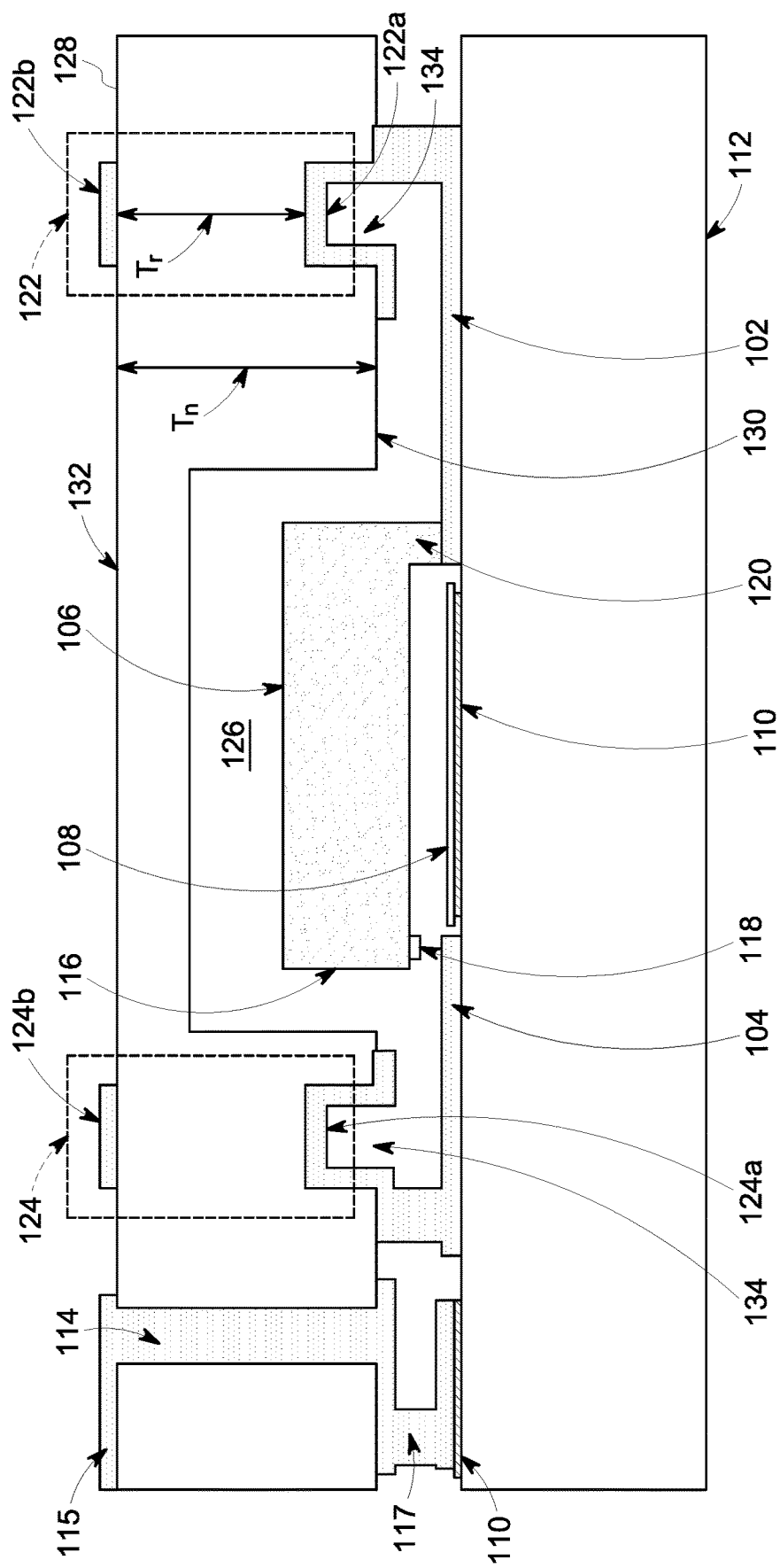
FIG. 1 illustrates a schematic partial cross-sectional view of an example RF MEMS device including integrated passive features in accordance with embodiments herein.

The following detailed description illustrates the inventive subject matter by way of example and not by way of limitation. The description enables one of ordinary skill in the art to make and use the inventive subject matter, describes several embodiments of the inventive subject matter, as well as adaptations, variations, alternatives, and uses of the inventive subject matter. Additionally, it is to be understood that the inventive subject matter is not limited in its application to the details of construction and the arrangements of components set forth in the following description or illustrated in the drawings. The inventive subject matter is capable of other embodiments and of being practiced or being carried out in various ways. Also, it is to be understood that the phraseology and terminology used herein is for the purpose of description and should not be regarded as limiting on all embodiments of the inventive subject matter.

The inventive subject matter described herein provides methods for forming wafer level stacked MEMS devices having integrated passive features (e.g., capacitors, inductors, and the like), along with devices formed thereby. Such methods and devices can enable the creation of higher performance RF circuits by integrating the passive MEMS features into a bonded wafer pair structure formed at least in part by a portion of an intermediate layer (e.g., an electromechanical MEMS feature layer, a cap, and the like). Such methods can reduce the time and cost to fabricate RF MEMS devices that include active features, passive MEMS features, and optionally, electromechanical MEMS features. Such methods also may reduce the size of the RF MEMS devices as compared to conventional RF MEMS devices. RF MEMS devices formed by the present methods may also exhibit improved performance compared to conventional RF MEMS devices due to one or more of reduced leakage current, increased voltage capability, athermal performance, and the like. For the sake of clarity, the specific example of an RF MEMS switch is discussed; however, the present methods can be applied to many different types of RF MEMS devices that utilize passive features. For example, the present methods may be utilized to fabricate RF MEMS devices and/or modules for selectively coupling and/or decoupling one or more inductors of an inductor system, such RF MEMS devices and/or modules being implemented in a magnetic resonance imaging (MRI) system, a radar system, and the like.

FIG. 1 illustrates a schematic partial cross-sectional view of an example RF MEMS device 100 including integrated passive features in accordance with embodiments herein. The RF MEMS device 100 includes, as active features, a source 102, a drain 104, and a gate 108 formed on and/or in the active feature substrate (or layer) 112. The source 102 and the drain 104 are selectively placed in conductive communication and pass electrical signals upon actuation of a switch 106. The switch 106 is one example of an electromechanical MEMS feature. The switch 106 is cantilevered and includes a beam portion 116 having a contact portion 118 disposed on a lower surface of a first end thereof for contacting the drain 104 and an anchor portion 120 on a second end opposite the first end. The anchor portion 120 is in electrical communication with the source 102. The switch 106 actuates so the contact portion 118 is in electrical communication with the drain 104 when a sufficient electrostatic force is applied to the switch 106 based on an actuation voltage applied at a gate 108. The actuation voltage is applied to the gate 108 through a gate line 110 in electrical communication with an electrical feedthrough 114 (e.g., a blind via). The electrical connection 114 (e.g., a feedthrough or the like) is in electrical communication with a voltage source (not shown) applied to a contact pad (not shown) on an exterior of the RF MEMS device 100 through conductive trace 115. When the contact portion 118 of the switch 106 contacts the drain 104, electrical signals are transmitted along a signal transmission line that includes at least the source 102 and the drain 104. (The example switch 106 is configured in a normally off position for the sake of clarity; however, switches biased to a normally on position are encompassed by the inventive subject matter described herein.)

The switch 106 is surrounded by a cavity 126 (e.g., an air cavity, gas cavity, or the like) formed by a barrier or cap 128 imposed on portions of the surface of the active feature layer at a peripheral region surrounding one or more electromechanical MEMS features (e.g., one or more switches 106) and active features (e.g., source 102, drain 104, and gate 108). The cap 128 includes an interior surface 130 and an opposed exterior surface 132. The cap 128 comprises an insulating substrate (e.g., silicon-based ceramic, an aluminum-based ceramic, or a tantalum-based ceramic, glass, fused silica, and the like) having good dielectric properties. The cap 128 may be bonded to the active feature substrate 112 at a peripheral region using at least one of metal thermocompression bonding, eutectic bonding, anodic bonding, localized direct laser bonding, or glass frit bonding of the cap to the passive substrate. In one example, the cap 128 is bonded to the active feature substrate 112 using Au-Au compression bonding. The cap 128 provides mechanical, electrical, chemical, and/or environmental protection for the underlaying active, passive, and/or electromechanical MEMS features.

The RF MEMS device 100 also includes, as passive MEMS features, a first capacitor 122 capacitively coupled with the source 102 and a second capacitor 124 capacitively coupled with the drain 104. In the example of FIG. 1, the first capacitor 122 includes a first capacitor plate 122*a* disposed on the interior surface 130 of the cap 128 in electrical communication with the source 102 and a second capacitor plate 122*b* disposed on the exterior surface 132 of the cap 128. The first capacitor plate 122*a* and the second capacitor plate 122*b* are aligned to overlay each other and spaced apart by the intervening portion of the cap 128. The intervening portion of the cap 128 establishes the gap for the first capacitor 122. The intervening portion of the cap 128 may also have a reduced height ($H_r$) compared to the height ($H_n$) of the portions of the cap 128 adjacent the intervening portion in order to tailor the capacitance of the first capacitor 122. For example, a cap having a 300 μm nominal height adjacent the intervening portion of the cap 128 can be etched on the interior surface 130 to reduce the height of the intervening portion of the cap 128 to 100 μm to create a partial via 134.

The second capacitor 124 includes a first capacitor plate 124*a* disposed on the interior surface 130 of the cap 128 in electrical communication with the drain 104 and a second capacitor plate 124*b* disposed on the exterior surface 132 of the cap 128 and is substantially similar to the first capacitor 124. As used herein, "substantially similar" indicates that the second capacitor 124 bears at least about 90% or more of the traits of the first capacitor 122.

The RF MEMS device 100 is configured to capacitively couple electrical signals to the source 102 through the first capacitor 122 and capacitively couple electrical signals out of the drain 104 through the second capacitor 124 of the RF MEMS device 100, eliminating direct electrical connections between the capacitors 122, 124 and the corresponding source 102 and drain 104.

The RF MEMS device 100 may also be hermetically sealed. The term "hermetic" refers to a bond or seal whose quality (e.g., leak rate) is defined in units of atm-cc/sec, which is the amount of gas (in cc) that is transferred into the package under an ambient atmospheric pressure or a range of ambient atmospheric pressures. For example, the passive MEMS layer (e.g., the bonded active substrate, cap, and, optionally, passive substrates housing the passive MEMS features) disclosed herein is capable of providing a hermetic seal having a leak rate no greater than about $5\times10^8$ atm cc/s air equivalent leak rate, and may exhibit a leak rate no higher than about $1\times10^6$ atm cc/sec air equivalent. Additionally or alternatively, the active feature layer disclosed herein is capable of providing a hermetic seal, with respect to the active features housed in the active feature layer, having a leak rate no greater than about $5\times10^8$ atm cc/s air equivalent, and may exhibit a leak rate no higher than about $1\times10^6$ atm cc/sec air equivalent. It is also considered that performance of a successful hermetic seal is to be judged by the user, designer or manufacturer as appropriate, and that "hermetic" ultimately implies a standard that is to be defined by a user, designer, manufacturer or other interested party.

The active features (e.g., the source 102, the drain 104, the gate 108, the gate line 110, and the like) are formed in and/or on the active feature substrate 112 and, together, comprise an active feature layer. In the instant disclosure, when features and/or layers are being described as "on" or "over" another feature, layer, or substrate, it is to be understood that the features, layers, and/or substrates can either be directly contacting each other in one embodiment or have another layer or feature between the layers in another embodiment, unless expressly stated to the contrary. Thus, these terms are simply describing the relative position of the features, layers, and/or substrates to each other and do not necessarily mean "on top of" since the relative position above or below depends upon the orientation of the device to the viewer. Additionally, the active feature layer may include various other substrates, active features, contacts for these features, and interconnects between these features. The active feature layer may be formed using semiconductor, CMOS (complementary metal oxide-semiconductor), and MEMS fabrication techniques.

The active feature layer may be made of materials appropriate for a particular active feature or system. Example materials used to form active feature layers include, but are not limited to, silicon (Si), Si compounds, germanium, germanium (Ge) compounds, gallium (Ga), Ga compounds, indium (In), In compounds, or other semiconductor materials and/or compounds. In addition, the active feature layer can include non-semiconductor substrate materials, including any dielectric materials, metals (e.g., titanium, gold, copper, and aluminum), or ceramics or organic materials found in printed wiring boards, for example. In an example, the active feature layer may be formed on a silicon carbide (SiC) or a gallium nitride (GaN) substrate. Materials, such as semiconductors, metals and metal alloys, are discussed in the instant disclosure using their common chemical abbreviation, such as commonly found on a periodic table of elements. For example, tantalum is represented by its common chemical abbreviation Ta, tantalum oxide is represented by its common chemical abbreviation TaO, and so forth.

The electromechanical MEMS feature layer includes the switch 106. The switch 106 may be formed directly on portions of the active feature layer. Additionally or alternatively, the electromechanical MEMS feature layer may include an intermediate layer (e.g., the cap 128) and electromechanical MEMS features (e.g., the switch 106) may be at least partially formed on the intermediate layer. The intermediate layer and/or the cap 128 may comprise an insulating substrate (e.g., silicon-based ceramic, an aluminum-based ceramic, or a tantalum-based ceramic, glass, fused silica, and the like) having good dielectric properties.

The connection 114, conductive trace 115, and the contact pad (not shown) on an exterior of the RF MEMS device 100 are formed from conductors such as metals and/or metal alloys, subject to appropriate considerations such as adhesion and thermal properties.

In accordance with one embodiment, a process for forming RF MEMS devices having integrated passive features is described in connection with FIG. 2 and FIGS. 3A-3E. It should be noted that for clarity, some portions of the fabrication process of the RF MEMS devices 100 are not included in FIG. 2 and only the portions of the device package proximate one active feature area (e.g., including one source 102, drain 104, and gate 108) of the active feature layer are illustrated in FIGS. 3A-3E. As such, the following fabrication process is not intended to be an exhaustive list that includes all steps required for fabricating the device package 100. In addition, the fabrication process is flexible because the process steps may be performed in a different order than the order illustrated in FIG. 2 or some steps may be performed simultaneously.

Figure 2:
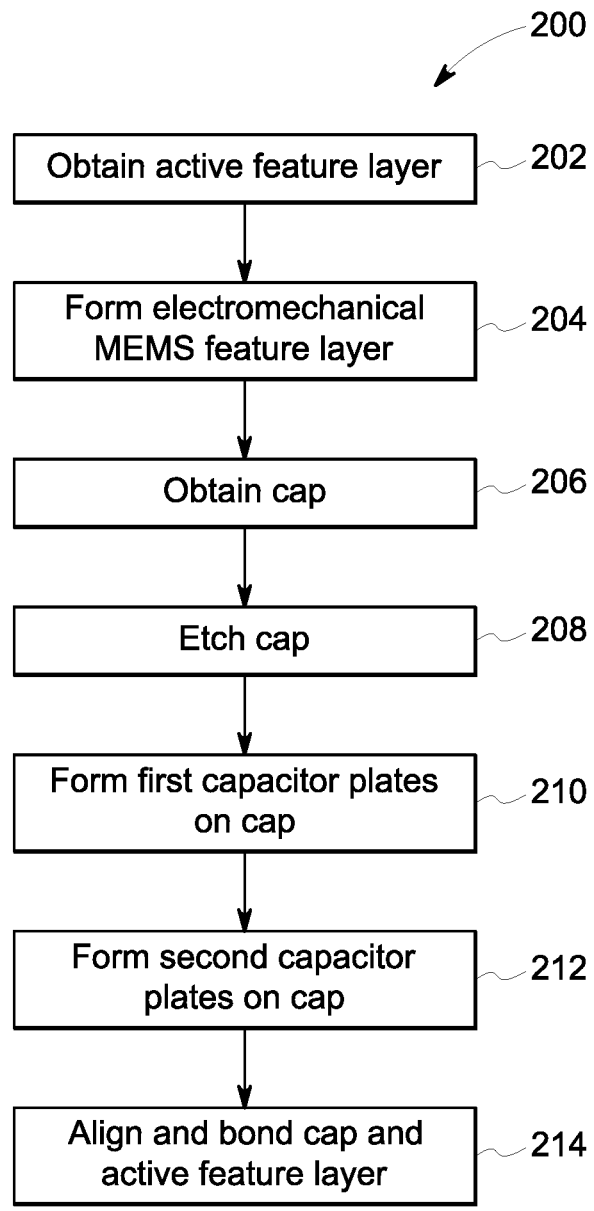
FIG. 2 is a flowchart describing an example process for fabricating the RF MEMS device of FIG. 1 in accordance with embodiments herein.

Referring now to FIGS. 2 and 3A, at 202, an active feature layer 302 is obtained. The active feature layer 302 includes active features (e.g., the source 102, the drain 104, the gate 108, the gate line 110, and the like) formed in and/or on the active feature substrate 112. (The active feature substrate/layer 302, 602 may also include capacitors and resistors, with or without additional active features.) The active feature layer may include various other active components, contacts for these components, and interconnects between these components. The active feature layer 302 has a first surface with one or more active feature areas 303. In one example, the active feature area 303 may include a three terminal active feature formed by the source 102, the drain 104, the gate 108, the gate line 110, and, optionally any additional conductive and/or metal features associated with the terminals.

At 204, the electromechanical MEMS feature layer is formed on the active feature layer. For example, the switch 106 may be formed directly on portions of the active feature layer 302 using techniques such as, for example and without limitation, suitable patterning, etching, anodization, electroplating, and deposition (e.g., chemical vapor deposition and/or physical vapor deposition) techniques. The switch 106 includes a beam portion 116 having a contact portion 118 disposed on a lower surface of a first end thereof and an anchor portion 120 on a second end opposite the first end, the anchor portion 120 in electrical communication with the source 102. The switch 106 may be formed from one or more different metals, such as gold, gold alloy, nickel, nickel alloy, tungsten, or the like. For example, the anchor portion 120 and the beam 116 may be formed by depositing a suitable seed layer on a portion of the source 102 (e.g., the source electrode itself or a conductive trace extending from the source electrode) and depositing a suitable metal on top of the seed layer. In an additional or alternative example, the contact 118 may be formed from a different type of metal or metal alloy than the beam 116 using, optionally, a suitable adhesion layer. The result of operation 204 is illustrated in FIG. 3B.

At 206, a cap 128 is obtained and, at 208, a recess corresponding to the cavity 126 and, optionally, partial vias 134 corresponding to one or more of the first and second capacitors 122, 124 and a through via 306 corresponding to the electrical connection 114 (e.g., a feedthrough, a blind via, or the like) are formed in the interior surface 130 of the cap 128. For example and without limitation, suitable patterning and etching techniques are used to create the recess corresponding to the cavity 126 and, optionally, partial vias 134 corresponding to one or more of the first and second capacitors 122, 124. The result of operation 208 is illustrated in FIG. 3C.

At 210, the first capacitor plates 122a, 124a, along with additional conductive and/or metal features to establish electrical communication between the various active, electromechanical, and passive features of the RF MEMS device 100 and, optionally, to bond the cap 128 to the active feature layer, are formed on the interior surface 130 of the cap 128. For example, the first capacitor plates 122a, 124a, along with any additional conductive and/or metal features, are formed on the cap 128 using techniques such as, for example and without limitation, suitable patterning, etching, anodization, electroplating, and deposition (e.g., chemical vapor deposition and/or physical vapor deposition) techniques. The result of operation 210 is illustrated in FIG. 3D.

Figure 3E:
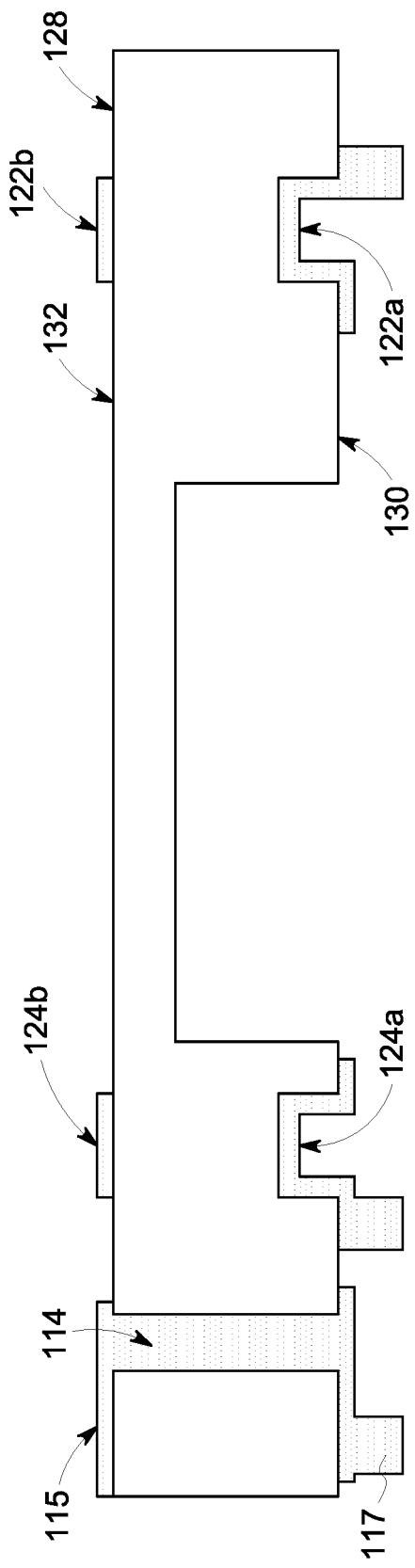

At 212, the second capacitor plates 122b, 124b, along with additional conductive and/or metal features (e.g., electrical connection 114 and conductive trace 115) to establish electrical communication between the various active, electromechanical, and passive features of the RF MEMS device 100, are formed on the exterior surface 132 of the cap 128. During formation, at least the second capacitor plates 122b, 124b are aligned with the first capacitor plates 122a, 124a using, e.g., a stepper, to ensure a high degree of geometric control and precise alignment between the first capacitor plates 122a, 124a and the second capacitor plates 122b, 124b, and, optionally, between any additional conductive and/or metal features. For example, the second capacitor plates 122b, 124b, along with any additional conductive and/or metal features, are formed on the exterior surface 132 of the cap 128 using techniques such as, for example and without limitation suitable patterning, etching, anodization, electroplating, and deposition (e.g., chemical vapor deposition and/or physical vapor deposition) techniques. The result of operation 212 is illustrated in FIG. 3E.

At 214, the interior surface 130 of the cap 128 is aligned with, imposed on, and bonded to the surface of the active feature layer bearing active features. For example, the recess corresponding to the cavity 126 is aligned with the switch 106, the first capacitor is aligned with and in electrical communication with the source 102, the second capacitor is aligned with and in electrical communication with the drain 104, and the gate line is aligned with and in electrical communication with a conductive contact 117 on the interior surface 130 of the cap 128. In one example, the cap 128 and the active feature layer are bonded using, e.g., an Au-Au compression bond. In an additional or alternative example, the cap 128 and the active feature layer are hermetically bonded. The result of operation 214 is illustrated in FIG. 1. Accordingly, the RF MEMS device 100 provides improved electrical, mechanical, and environmental isolation.

Figure 4:
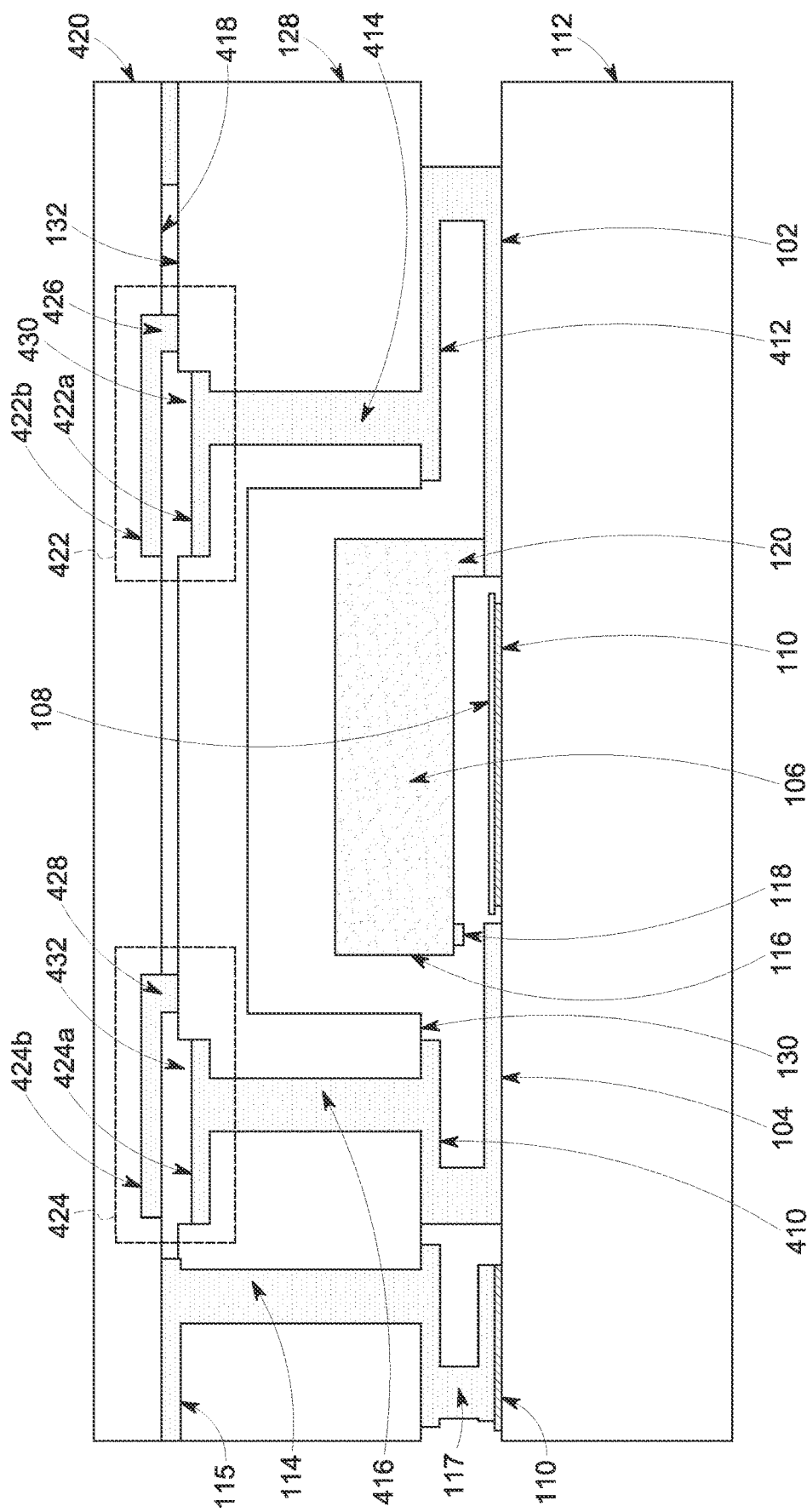
FIG. 4 illustrates a schematic partial cross-sectional view of an example RF MEMS device including integrated passive features in accordance with embodiments herein.

FIG. 4 illustrates a schematic partial cross-sectional view of an example RF MEMS device 400 including integrated passive features in accordance with embodiments herein. The RF MEMS device 400 includes many common active features and electromechanical MEMS features as the RF MEMS device 100 of FIG. 1 (as indicated by the common reference numbers), but differs with regard to the configuration of the integrated passive features. The RF MEMS device 400 includes a first capacitor 422 that is in electrical communication with the source 102 through electrical connection 414 (e.g., a feedthrough or the like) and a second capacitor 424 that is in electrical communication with the drain 104 through electrical connection 416. The RF MEMS device 400 is configured to conduct electrical signals and/or energy to the source 102 through the first capacitor 422 and conduct electrical signals and/or energy out of the drain 104 through the second capacitor 424.

In the example of FIG. 4, the first capacitor 422 includes a first capacitor plate 422a disposed on the exterior surface 132 of the cap 128 for the active feature layer. The first capacitor plate 422a is in electrical communication with the source 102 through the electrical connection 414 (e.g., a feedthrough, a blind via, or the like) that extends through the cap 128 to an electrical contact 412 disposed on the interior surface 130 of the cap 128. The first capacitor 422 includes a second capacitor plate 422b disposed on an interior surface 418 of a passive substrate 420 for the passive MEMS feature layer. The first capacitor plate 422a and the second capacitor plate 422b are disposed in a first recess 430 between the cap 128 and the passive substrate 420. The first capacitor plate 422a and the second capacitor plate 422b are aligned to overlay each other and are spaced apart by a gap normal to the first capacitor plate 422a.

Likewise, the second capacitor 424 includes a first capacitor plate 424a disposed on the exterior surface 132 of the cap 128 for the active feature layer. The first capacitor plate 424a is in electrical communication with the source 102 through electrical connection 416 (e.g., a feedthrough, a blind via, or the like) extending through the cap 128 and the electrical contact 410 disposed on the interior surface 130 of the cap 128. The second capacitor 424 includes a second capacitor plate 424b disposed on the interior surface 418 of the passive substrate 420 for the passive MEMS feature layer. The first capacitor plate 424a and the second capacitor plate 424b are disposed in a second recess 432 between the cap 128 and the passive substrate 420. The first capacitor plate 424a and the second capacitor plate 424b are aligned to overlay each other and are spaced apart by a gap normal to the first capacitor plate 424a.

The cap 128 and the passive substrate 420 each comprise an insulating substrate (e.g., silicon-based ceramic, an aluminum-based ceramic, or a tantalum-based ceramic, glass, fused silica, and the like) having good dielectric properties. The cap 128 and the passive substrate 420 each provide mechanical, electrical, chemical, and/or environmental protection for the underlaying active, passive, and/or electromechanical MEMS features. The cap and the passive substrate may be bonded using, for example and without limitation, metal thermocompression bonding, eutectic bonding, anodic bonding, localized direct laser bonding, or glass frit bonding of the cap to the passive substrate. In one example, the cap and passive substrate are bonded using Au-Au compression bonding. The RF MEMS device 400 may also be hermetically sealed between the cap and the active feature layer and/or the cap and the passive substrate.

Optionally, one or more of the first capacitor 422 and the second capacitor 424 are configured to exhibit athermal performance. The term "athermal performance" refers to the stability of a device (e.g., a passive MEMS device) over a range of operating temperatures. In an example, the first and second capacitors 422, 424 may be formed by balancing the height of the first capacitor plates 422a, 424a, the second capacitor plates 422b, 424b, and adjacent features (e.g., bonding pads 426, 428) on opposing sides of the respective cavity 430, 432 to cancel out coefficient of thermal expansion (CTE) effects over a select range of temperatures (e.g. a range of operating temperatures). In an additional or alternative example, the height of the first capacitor plates 422a, 424a, the second capacitor plates 422b, 424b, and adjacent features (e.g., bonding pads 426, 428) are formed to have a common height (normal to the first capacitor plate 422a, 424a) and the first capacitor plates 422a, 424a are disposed in a recess 434, 436 formed in the cap. The depth of the recess 434, 436 normal to the first capacitor plates 422a, 424a is greater than the common height and establishes the gap between the first capacitor plates 422a, 424a and the second capacitor plates 422b, 424b. Over a range of operating temperatures, the first capacitor plates 422a, 424a, the second capacitor plates 422b, 424b, and adjacent features (e.g., bonding pads 426, 428), may exhibit a change in height due to the CTE of the material forming said features. Due to the common height, the changes in height for each of the first capacitor plates 422a, 424a, the second capacitor plates 422b, 424b, and adjacent features (e.g., bonding pads 426, 428) for one or more of the capacitors 422, 424 will be the same. Accordingly, the air gap for the capacitors 422, 424 will remain the same over the range of operating temperatures regardless of CTE effects, ensuring athermal performance of the capacitors 422, 424.

In accordance with one embodiment of the inventive subject matter described herein, an example process for forming RF MEMS devices having integrated passive features is discussed in regard to FIG. 5 and FIGS. 6A-6G. It should be noted that for clarity, some portions of the fabrication process of the RF MEMS device 400 are not included in FIG. 5 and only the portions of the device package proximate one active feature area (e.g., including one source 102, drain 104, and gate 108) of the active feature layer are illustrated in FIGS. 6A-6G. As such, the following fabrication process is not intended to be an exhaustive list that includes all steps required for fabricating the device package 400. In addition, the fabrication process is flexible because the process steps may be performed in a different order than the order illustrated in FIG. 5 or some steps may be performed simultaneously.

Figure 5:
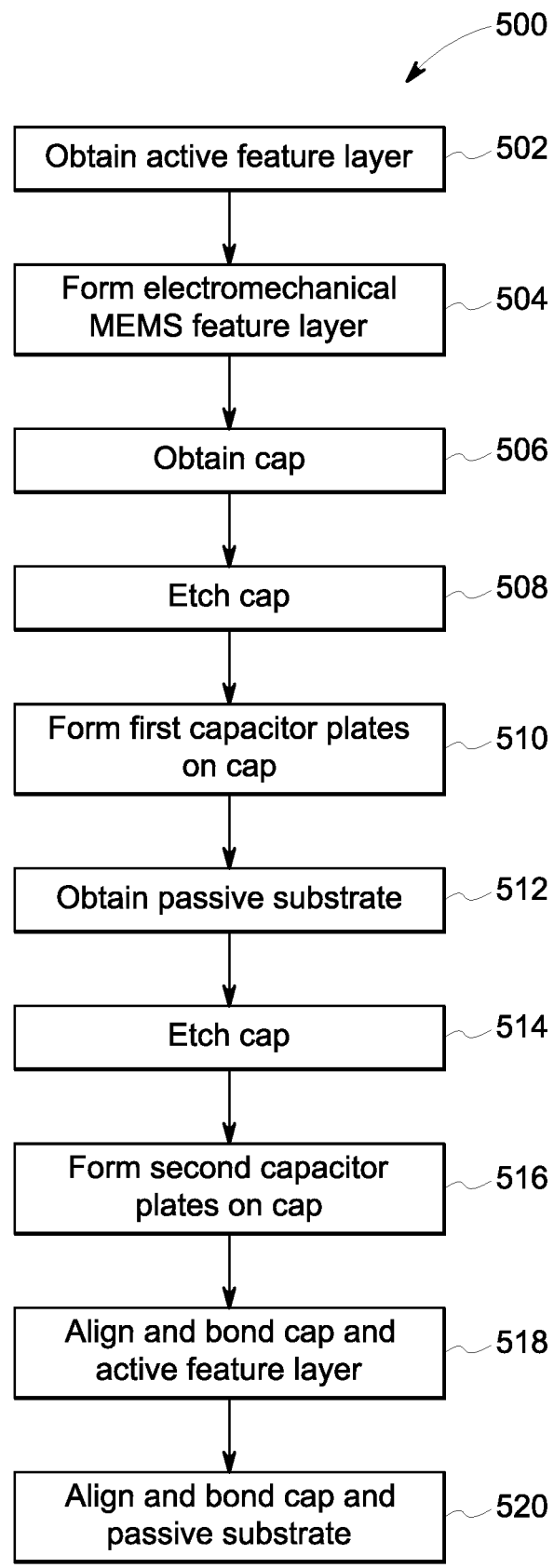
FIG. 5 is a flowchart describing an example process for fabricating the RF MEMS device of FIG. 4 in accordance with embodiments herein.
Figure 6A:
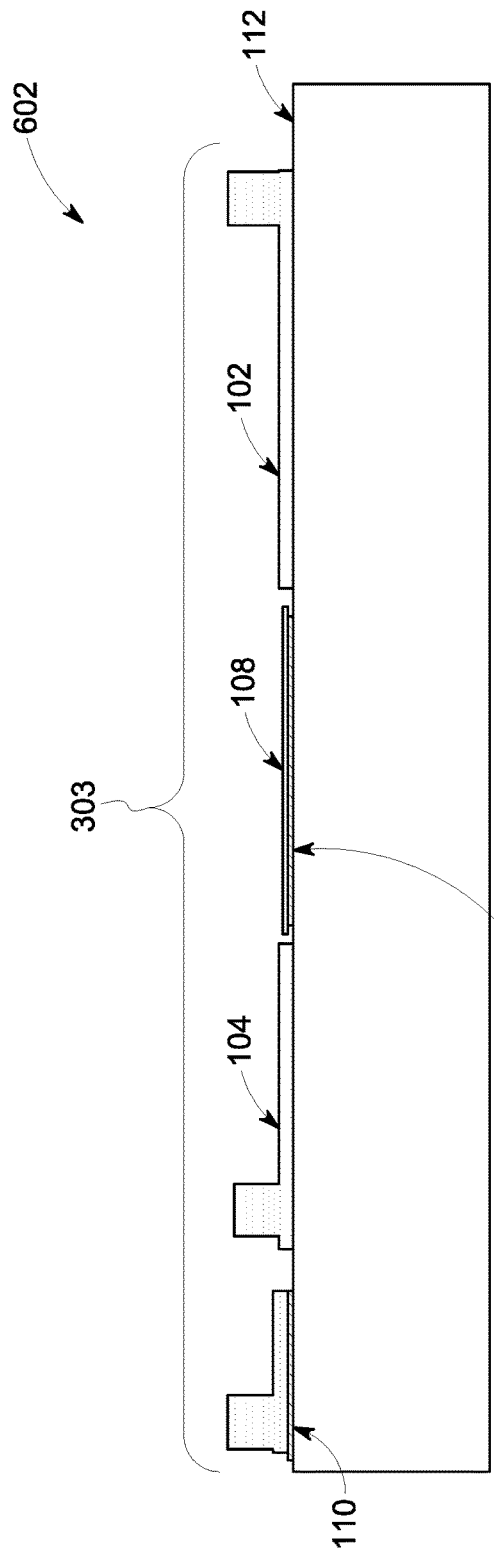
FIG. 6A-6G are schematic, partial cross-sectional views illustrating the fabrication steps of the process of FIG. 5 in accordance with embodiments herein.

Referring now to FIGS. 5 and 6A, at 502, an active feature layer 602 is obtained, as described above.

Figure 6B:
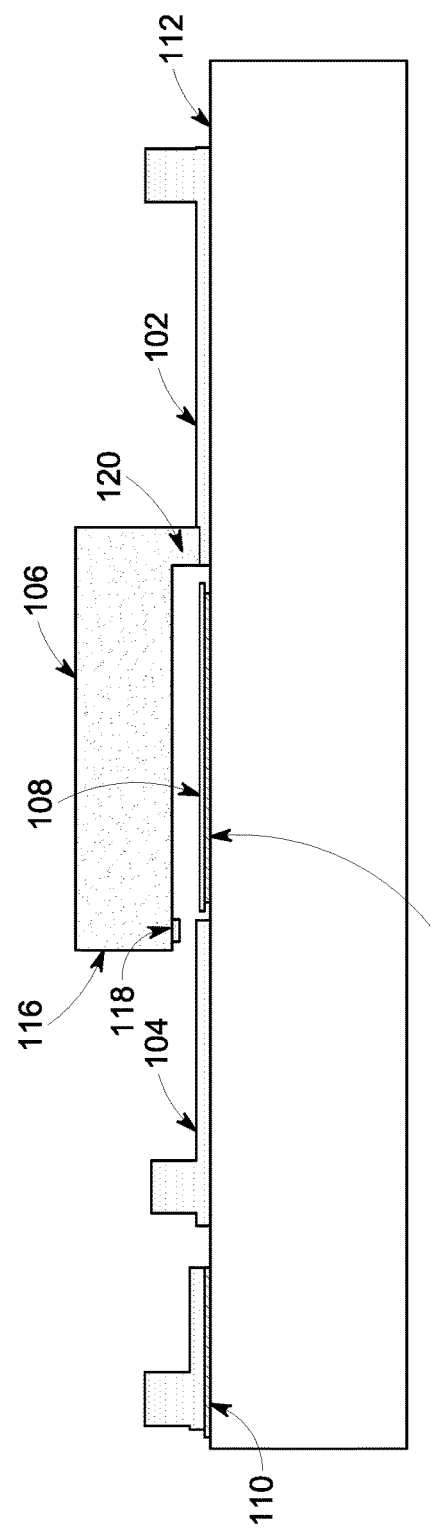

At 504, the electromechanical MEMS feature layer is formed on the active feature layer as described above. The result of 504 is illustrated in FIG. 6B.

Figure 6C:
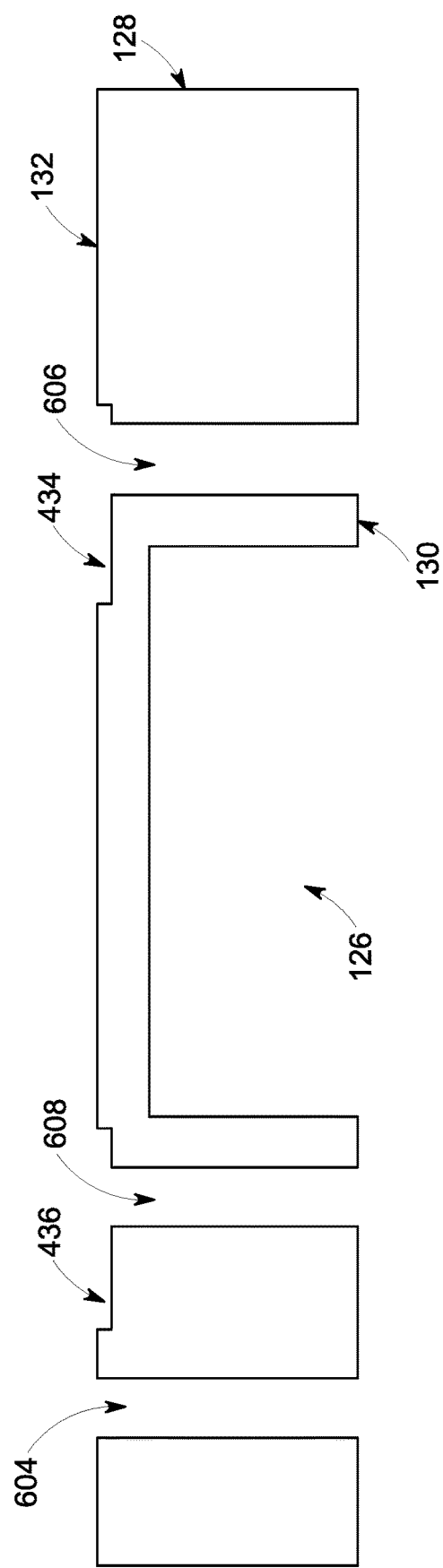

At 506, the cap 128 for the active feature layer is obtained and, at 508, the recess corresponding to the cavity 126, through vias 604, 606 corresponding to the first and second electrical connections 414, 416 (e.g., feedthroughs or the like), and a through via 608 corresponding to the electrical connection 114 (e.g., a feedthrough, a blind via, or the like) are formed in the interior surface 130 or through the height of the cap 128 as appropriate. Optionally, recesses 434, 436 corresponding to one or more of the first capacitor plates 422a, 424a are formed in the exterior surface 132 of the cap. For example, suitable patterning and etching techniques are used to create the recess corresponding to the cavity 126, the through vias corresponding to electrical connections 114, 414, 416, and, optionally, the recesses 434, 436 corresponding to one or more of the first and second capacitor plates 422a, 424a. The result of operation 508 is illustrated in FIG. 6C.

Figure 6D:
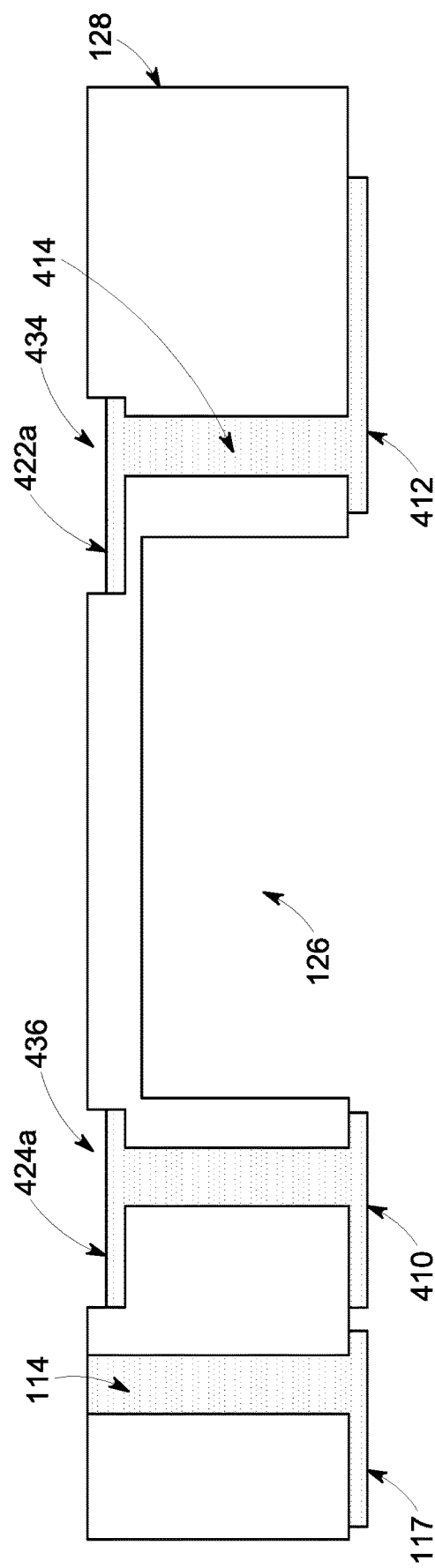

At 510, the first capacitor plates 422a, 424a, the electrical contacts 410, 412, the electrical connections 114, 414, 416, (e.g., feedthroughs, blind vias, or the like) along with additional conductive and/or metal features to establish electrical communication between the various active, electromechanical, and passive features of the RF MEMS device 400 and, optionally, to bond the cap 128 to one or more of the active feature layer and the passive substrate 420, are formed on the interior surface 130 and the exterior surface 132 of the cap 128, as appropriate. For example, the first capacitor plates 422a, 424a, the electrical contacts 410, 412, the electrical connections 114, 414, 416, along with additional conductive and/or metal features, are formed on the cap 128 using techniques such as, for example and without limitation, suitable patterning, etching, anodization, electroplating, and deposition (e.g., chemical vapor deposition and/or physical vapor deposition) techniques. The passive substrate 420 may have the at least one of the silicon-based ceramic, aluminum-based ceramic, or tantalum-based ceramic formed within the passive substrate 420. The result of operation 510 is illustrated in FIG. 6D.

Figure 6E:
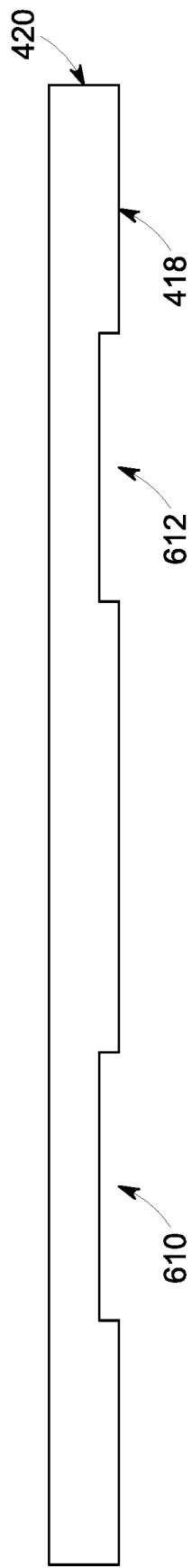

At 512, the passive substrate 420 is obtained and, at 514, optionally, recesses 610, 612 corresponding to one or more of the second capacitor plates 422b, 424b are formed in the interior surface 418 of the cap. For example and without limitation, suitable patterning and etching techniques are used to create the recesses corresponding to one or more of the second capacitor plates 422b, 424b. The result of operation 512 is illustrated in FIG. 6E.

Figure 6F:
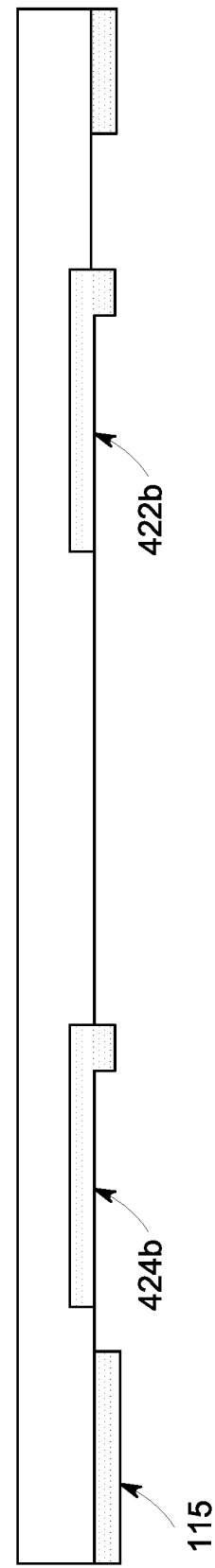

At 514, the second capacitor plates 422b, 424b, along with additional conductive and/or metal features to establish electrical communication between the various active, electromechanical, and passive features of the RF MEMS device 400 and, optionally, to bond the passive substrate 420 to the cap 128, are formed on the interior surface 418 of the passive substrate 420. For example, the second capacitor plates 422b, 424b, along with additional conductive and/or metal features, are formed on the interior surface 418 of the passive substrate 420 using techniques such as, for example and without limitation suitable patterning, etching, anodization, and deposition (e.g., chemical vapor deposition and/or physical vapor deposition) techniques. The result of operation 514 is illustrated in FIG. 6F.

Figure 6G:
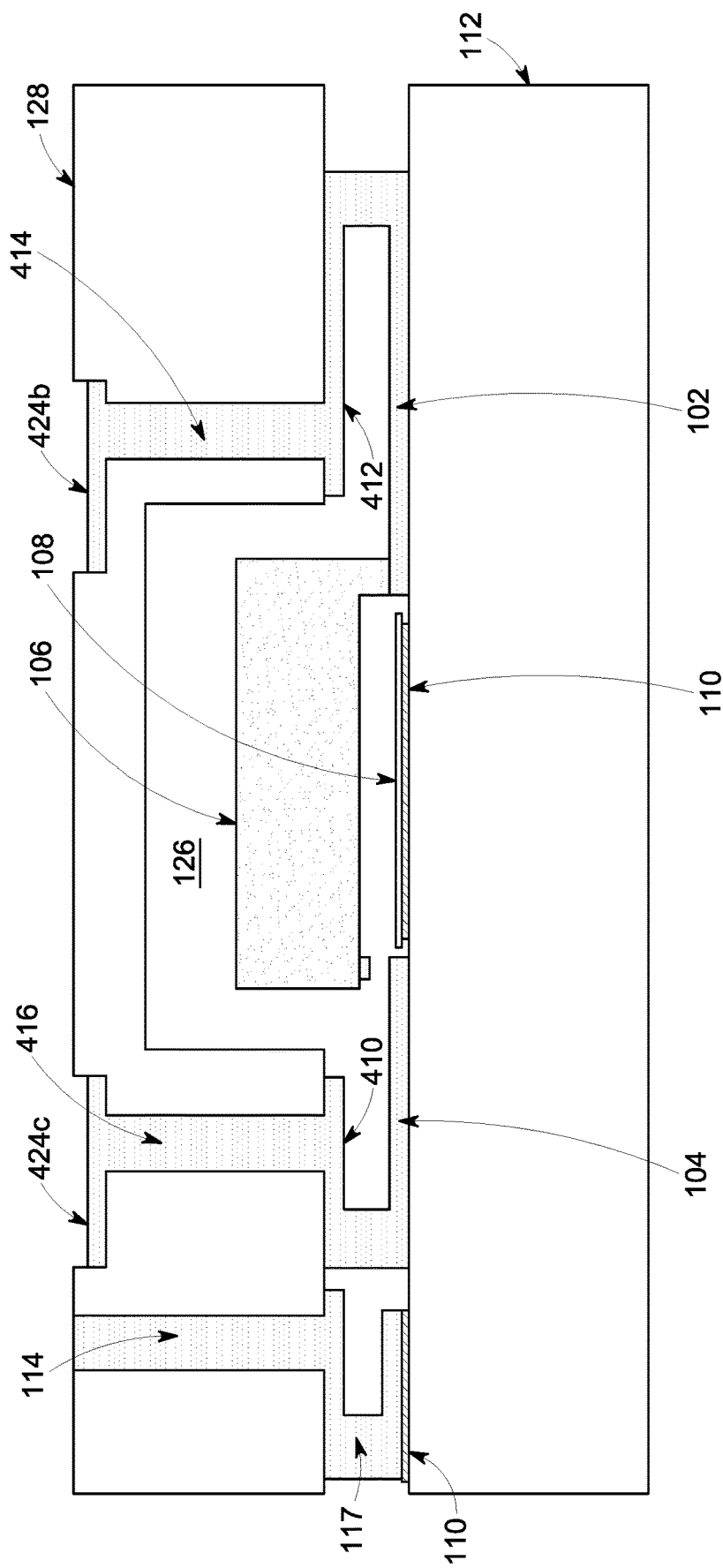

At 516, the interior surface 130 of the cap 128 is aligned with, imposed on, and bonded to the surface of the active feature layer bearing active features. For example, the recess corresponding to the cavity 126 is aligned with the switch 106, the first capacitor plate 422a is aligned with and in electrical communication with the source 102, the second capacitor plate 424a is aligned with and in electrical communication with the drain 104, and the gate line 110 is aligned with and in electrical communication with a conductive contact 117 on the interior surface 130 of the cap 128. In one example, the cap 128 and the active feature layer are bonded using an Au-Au compression bond. In an additional or alternative example, the cap 128 and the active feature layer are hermetically bonded. The result of operation 516 is illustrated in FIG. 6G.

At 518, the interior surface 418 of the passive substrate 420 is aligned with, imposed on, and bonded to the exterior surface 132 of the cap layer 128. For example, the first capacitor plate 422a and the second capacitor plate 422b are aligned to form the first capacitor 422. Likewise, the first capacitor plate 424a and the second capacitor plate 424b are aligned to form the second capacitor 424. In one example, the cap 128 and the passive substrate 420 are bonded using an Au-Au compression bond. In an additional or alternative example, the cap 128 and the passive substrate 420 are hermetically bonded. The result of operation 518 is illustrated in FIG. 4. Accordingly, the RF MEMS device 400 provides improved electrical, mechanical, and environmental isolation as well as athermal performance.

In one embodiment, a method includes obtaining an active feature layer. The active feature layer has a first surface bearing one or more active feature areas and a cap disposed on the active feature layer over the one or more active feature areas. A first electrical connection is formed in electrical communication with a first active feature through a first contact pad disposed on an interior surface of the cap.

A first capacitor plate of a first capacitor is formed on an exterior surface of the cap in electrical communication with the electrical connection. A first bonding pad is formed at a different, spaced-apart location from the first capacitor plate on the exterior surface of the cap. A second capacitor plate of the first capacitor is formed on an interior surface of a passive layer substrate. The passive layer substrate includes at least one of a silicon-based ceramic, an aluminum-based ceramic, or a tantalum-based ceramic. The cap is coupled with the passive layer substrate so that a first area of the first bonding pad on the cap contacts the second capacitor plate of the first capacitor on the passive layer substrate and a different, second area of the second capacitor plate of the first capacitor overlays and is spaced apart from the first capacitor plate of the first capacitor along a direction that is orthogonal to the exterior surface of the cap to form the first capacitor. The cap is bonded with the passive layer substrate.

Optionally, forming includes forming a second electrical connection in electrical communication with a second active feature through a second contact pad disposed on the interior surface of the cap, a first capacitor plate of a second capacitor on the exterior surface of the cap in electrical communication with the electrical connection, and a second bonding pad at a different, spaced-apart location from the second capacitor plate of the second capacitor on the exterior surface of the cap, wherein the first capacitor plate of the second capacitor and the second bonding pad are at a different, spaced-apart location from the first capacitor plate and the first bonding pad on the exterior surface of the cap. Optionally, forming further includes forming a second capacitor plate of the second capacitor on the interior surface of the passive layer substrate, wherein the second capacitor plate of the second capacitor is at different, spaced-apart location from the second capacitor plate of the first capacitor on the interior surface of the passive layer substrate. Optionally, coupling further includes coupling the cap with the passive layer substrate so that a first area of the second bonding pad on the cap contacts the second capacitor plate of the second capacitor on the passive layer substrate and a different, second area of the second capacitor plate of the second capacitor overlays and is spaced apart from the first capacitor plate of the second capacitor along a direction that is orthogonal to the exterior surface of the cap to form the second capacitor.

Optionally, bonding includes bonding the cap to the passive substrate at a peripheral region using at least one of metal thermocompression bonding, eutectic bonding, anodic bonding, localized direct laser bonding, or glass frit bonding of the cap to the passive substrate.

Optionally, bonding includes hermetically bonding the cap to the passive substrate.

Optionally, the first bonding pad is formed to extend away from the exterior surface of the cap past the first capacitor plate.

Optionally, the method includes forming a recess in the exterior surface of the cap and forming the first capacitor plate of the first capacitor formed in the recess.

Optionally, the method includes selecting common height for each of the first capacitor plate, the first bonding pad, and the second capacitor plate.

Optionally, the cap includes at least one of a silicon-based ceramic, an aluminum-based ceramic, or a tantalum-based ceramic.

Optionally, the at least one of the silicon-based ceramic, an aluminum-based ceramic, or a tantalum-based ceramic is formed within the passive layer substrate.

Optionally, the first electrical connection is a blind via.

Optionally, the electrical communication includes electrical conduction.

Optionally, the method includes forming an electromechanical MEMS device layer on one or more portions of the active feature layer.

In one embodiment, a method includes obtaining an active feature layer having a first surface bearing one or more active feature areas. A first capacitor plate of a first capacitor is formed on an interior surface of a cap. A second capacitor plate of the first capacitor is formed on an exterior surface of the cap. The first capacitor plate of the first capacitor overlays and is spaced apart from the second capacitor plate of the first capacitor along a direction that is orthogonal to the exterior surface of the cap to form the first capacitor. The cap is coupled with the first surface of the active feature layer such that the second capacitor plate of the first capacitor is in electrical communication with at least a first active feature of the active feature layer. The cap is bonded with the passive layer substrate.

Optionally, the forming includes forming a first capacitor plate of a second capacitor on the interior surface of the cap, wherein the first capacitor plate of the second capacitor is at different, spaced-apart location from the first capacitor plate of the first capacitor on the interior surface of the cap; and forming a second capacitor plate of the second capacitor on an exterior surface of the cap, wherein the first capacitor plate of the second capacitor overlays and is spaced apart from the first capacitor plate of the second capacitor along a direction that is orthogonal to the exterior surface of the cap to form the second capacitor. Optionally, coupling includes coupling the cap with the first surface of the active feature layer such that the second capacitor plate of the second capacitor is in electrical communication with at least a second active feature of the active feature layer.

Optionally, the coupling includes positioning the first capacitor with respect to the first active feature and positioning the second capacitor with respect to the second active feature such that the capacitor induces a current in the one or more active features through capacitive coupling when the capacitor is charged.

Optionally, the method includes forming a recess the interior surface of the cap and forming the first capacitor plate of the first capacitor in the recess.

Optionally, the method includes forming an electromechanical MEMS device layer on one or more portions of the active feature layer.

Optionally, the electromechanical device layer includes one or more MEMS switches.

Optionally, the method includes forming a recess in the interior surface of the cap and positioning one or more MEMS switches in the recess.

Optionally, the cap includes at least one of a silicon-based ceramic, an aluminum-based ceramic, or a tantalum-based ceramic.

Optionally, bonding includes bonding the cap to the passive substrate at a peripheral region using at least one of metal thermocompression bonding, eutectic bonding, anodic bonding, localized direct laser bonding, or glass frit bonding of the cap to the active feature layer.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are example embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

Changes can be made in the above constructions without departing from the scope of the disclosure, it is intended that all matter contained in the above description or shown in the accompanying drawings shall be interpreted as illustrative and not in a limiting sense.

What is claimed is:

1. A method, comprising:
   obtaining an active feature layer having a first surface bearing one or more active feature areas;
   forming a first capacitor plate of a first capacitor on an interior surface of a cap, wherein the cap includes at least one of a silicon-based ceramic, an aluminum-based ceramic, or a tantalum-based ceramic;
   forming a second capacitor plate of the first capacitor on an exterior surface of the cap, wherein the first capacitor plate of the first capacitor overlays and is spaced apart from the second capacitor plate of the first capacitor along a direction that is orthogonal to the exterior surface of the cap to form the first capacitor;
   forming a first capacitor plate of a second capacitor on the interior surface of the cap, wherein the first capacitor plate of the second capacitor is at a different, spaced-apart location from the first capacitor plate of the first capacitor on the interior surface of the cap;
   forming a second capacitor plate of the second capacitor on an exterior surface of the cap, wherein the first capacitor plate of the second capacitor overlays and is spaced apart from the first capacitor plate of the second capacitor along a direction that is orthogonal to the exterior surface of the cap to form the second capacitor;
   coupling the cap with the first surface of the active feature layer such that the second capacitor plate of the first capacitor is in electrical communication with at least a first active feature of the active feature layer and such that the second capacitor plate of the second capacitor is in electrical communication with at least a second active feature of the active feature layer; and
   bonding the cap with a passive layer substrate.

2. The method of claim 1, wherein the coupling further comprises positioning the first capacitor with respect to the first active feature and positioning the second capacitor with respect to the second active feature such that the capacitor induces a current in the one or more active features through capacitive coupling when the capacitor is charged.

3. The method of claim 1, further comprising forming a recess the interior surface of the cap and forming the first capacitor plate of the first capacitor in the recess.

4. The method of claim 1, further comprising forming an electromechanical MEMS device layer on one or more portions of the active feature layer.

5. The method of claim 4, wherein the electromechanical MEMS device layer includes one or more MEMS switches.

6. The method of claim 5, further comprising forming a recess in the interior surface of the cap and positioning the one or more MEMS switches in the recess.

7. The method of claim 5, wherein the one or more active feature areas include active features and circuitry associated with MEMS switches.

8. The method of claim 1, wherein bonding further comprises bonding the cap to the passive layer substrate at a peripheral region using at least one of metal thermocompression bonding, eutectic bonding, anodic bonding, localized direct laser bonding, or glass frit bonding of the cap to the active feature layer.

9. A method, comprising:
   obtaining an active feature layer having a first surface bearing one or more active feature areas;
   forming a first capacitor plate of a first capacitor on an interior surface of a cap, wherein the cap includes at least one of a silicon-based ceramic, an aluminum-based ceramic, or a tantalum-based ceramic;
   forming a second capacitor plate of the first capacitor on an exterior surface of the cap, wherein the first capacitor plate of the first capacitor overlays and is spaced apart from the second capacitor plate of the first capacitor along a direction that is orthogonal to the exterior surface of the cap to form the first capacitor;
   coupling the cap with the first surface of the active feature layer such that the second capacitor plate of the first capacitor is in electrical communication with at least a first active feature of the active feature layer;

bonding the cap with a passive layer substrate; and forming an electromechanical MEMS device layer on one or more portions of the active feature layer.

10. The method of claim 9, further comprising forming a first capacitor plate of a second capacitor on the interior surface of the cap, wherein the first capacitor plate of the second capacitor is at a different, spaced-apart location from the first capacitor plate of the first capacitor on the interior surface of the cap; and forming a second capacitor plate of the second capacitor on an exterior surface of the cap, wherein the first capacitor plate of the second capacitor overlays and is spaced apart from the first capacitor plate of the second capacitor along a direction that is orthogonal to the exterior surface of the cap to form the second capacitor; and wherein the coupling further comprises coupling the cap with the first surface of the active feature layer such that the second capacitor plate of the second capacitor is in electrical communication with at least a second active feature of the active feature layer.

11. The method of claim 10, wherein the coupling further comprises positioning the first capacitor with respect to the first active feature and positioning the second capacitor with respect to the second active feature such that the capacitor induces a current in the one or more active features through capacitive coupling when the capacitor is charged.

12. The method of claim 9, further comprising forming a recess the interior surface of the cap and forming the first capacitor plate of the first capacitor in the recess.

13. The method of claim 9, wherein the electromechanical MEMS device layer includes one or more MEMS switches.

14. The method of claim 13, further comprising forming a recess in the interior surface of the cap and positioning the one or more MEMS switches in the recess.

15. The method of claim 13, wherein the one or more active feature areas include active features and circuitry associated with MEMS switches.

16. The method of claim 9, wherein bonding further comprises bonding the cap to the passive layer substrate at a peripheral region using at least one of metal thermocompression bonding, eutectic bonding, anodic bonding, localized direct laser bonding, or glass frit bonding of the cap to the active feature layer.

17. A method, comprising:

obtaining an active feature layer having a first surface bearing one or more active feature areas;

forming a first capacitor plate of a first capacitor on an interior surface of a cap, wherein the cap includes at least one of a silicon-based ceramic, an aluminum-based ceramic, or a tantalum-based ceramic;

forming a second capacitor plate of the first capacitor on an exterior surface of the cap, wherein the first capacitor plate of the first capacitor overlays and is spaced apart from the second capacitor plate of the first capacitor along a direction that is orthogonal to the exterior surface of the cap to form the first capacitor;

coupling the cap with the first surface of the active feature layer such that the second capacitor plate of the first capacitor is in electrical communication with at least a first active feature of the active feature layer; and bonding the cap with a passive layer substrate at a peripheral region using at least one of metal thermocompression bonding, eutectic bonding, anodic bonding, localized direct laser bonding, or glass frit bonding of the cap to the active feature layer.

18. The method of claim 17, further comprising forming a first capacitor plate of a second capacitor on the interior surface of the cap, wherein the first capacitor plate of the second capacitor is at a different, spaced-apart location from the first capacitor plate of the first capacitor on the interior surface of the cap; and forming a second capacitor plate of the second capacitor on an exterior surface of the cap, wherein the first capacitor plate of the second capacitor overlays and is spaced apart from the first capacitor plate of the second capacitor along a direction that is orthogonal to the exterior surface of the cap to form the second capacitor; and wherein the coupling further comprises coupling the cap with the first surface of the active feature layer such that the second capacitor plate of the second capacitor is in electrical communication with at least a second active feature of the active feature layer.

19. The method of claim 18, wherein the coupling further comprises positioning the first capacitor with respect to the first active feature and positioning the second capacitor with respect to the second active feature such that the capacitor induces a current in the one or more active features through capacitive coupling when the capacitor is charged.

20. The method of claim 17, further comprising forming a recess the interior surface of the cap and forming the first capacitor plate of the first capacitor in the recess.

* * * * *